(12) United States Patent
Fung et al.

(10) Patent No.: US 8,633,070 B2
(45) Date of Patent: Jan. 21, 2014

(54) LIGHTLY DOPED SOURCE/DRAIN LAST METHOD FOR DUAL-EPI INTEGRATION

(75) Inventors: Ka-Hing Fung, Hsinchu (TW); Haiting Wang, Hsinchu (TW); Han-Ting Tsai, Kaoshiung (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 319 days.

(21) Appl. No.: 12/716,100

(22) Filed: Mar. 2, 2010

(65) Prior Publication Data

US 2011/0193179 A1 Aug. 11, 2011

Related U.S. Application Data

(60) Provisional application No. 61/303,039, filed on Feb. 10, 2010.

(51) Int. Cl.
*H01L 21/84* (2006.01)
(52) U.S. Cl.
USPC ............... 438/163; 257/E21.64; 257/E21.634
(58) Field of Classification Search
USPC ..................................... 438/163; 257/E21.64
See application file for complete search history.

(56) References Cited

U.S. PATENT DOCUMENTS

| 5,504,031 | A | * | 4/1996 | Hsu et al. ................. 438/231 |
| 5,631,485 | A | * | 5/1997 | Wei et al. ................. 257/344 |
| 5,874,343 | A | * | 2/1999 | Fulford et al. ............. 438/305 |
| 6,071,783 | A | * | 6/2000 | Liang et al. ............... 438/301 |
| 6,153,455 | A |   | 11/2000 | Ling et al. |
| 6,171,910 | B1 | * | 1/2001 | Hobbs et al. ............. 438/275 |
| 6,323,077 | B1 |   | 11/2001 | Guo |
| 6,429,084 | B1 | * | 8/2002 | Park et al. ............... 438/305 |
| 7,098,514 | B2 | * | 8/2006 | Oh et al. ................. 257/384 |
| 2008/0277735 | A1 | * | 11/2008 | Ko et al. ................. 257/369 |
| 2009/0039389 | A1 | * | 2/2009 | Tseng et al. ............. 257/190 |
| 2009/0121256 | A1 | * | 5/2009 | Shin ..................... 257/190 |

OTHER PUBLICATIONS

Quirk et al., "Semiconductor Manufacturing Technology", 2001. Prentice-Hall, Inc.; pp. 205-222.*

* cited by examiner

*Primary Examiner* — Allen Parker
(74) *Attorney, Agent, or Firm* — Haynes and Boone, LLP

(57) ABSTRACT

An integrated circuit device and method for fabricating the integrated circuit device is disclosed. The method involves providing a substrate; forming a gate structure over the substrate; forming an epitaxial layer in a source and drain region of the substrate that is interposed by the gate structure; and after forming the epitaxial layer, forming a lightly doped source and drain (LDD) feature in the source and drain region.

20 Claims, 5 Drawing Sheets

LIGHTLY DOPED SOURCE/DRAIN LAST METHOD FOR DUAL-EPI INTEGRATION

PRIORITY DATA

This application claims priority to Provisional U.S. Patent Application Ser. No. 61/303,039, filed on Feb. 10, 2010, the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as metal-oxide-semiconductor field-effect transistors (MOSFETs), are scaled down through various technology nodes, strained source/drain features have been implemented using epitaxial (epi) semiconductor materials to enhance carrier mobility and improve device performance. Fabricating a MOSFET could include epitaxially growing a silicon layer in a source and drain region of an n-type device, and epitaxially growing a silicon germanium layer (SiGe) in a source and drain region of a p-type device. This can be referred to as a dual-epi process. Conventional techniques form lightly doped source and drain (LDD) regions for the n-type and p-type devices, respectively, prior to the dual-epi process (for example, before forming the Si epi and SiGe epi layers). Although existing approaches for forming LDD regions for IC devices have been generally adequate for their intended purposes, they have not been entirely satisfactory in all respects.

SUMMARY

The present disclosure provides for many different embodiments. According to one of the broader forms of the invention, a method includes providing a substrate; forming a gate structure over the substrate; forming an epitaxial layer in a source and drain region of the substrate that is interposed by the gate structure; and after forming the epitaxial layer, forming a lightly doped source and drain (LDD) feature in the source and drain region.

According to another of the broader forms of the invention, a method includes forming a first gate structure and a second gate structure over a substrate; forming an epitaxial layer of a first material in a source and drain region of the substrate that is interposed by the first gate structure; forming an epitaxial layer of a second material in another source and drain region of the substrate that is interposed by the second gate structure; and after forming the epitaxial layers, forming lightly doped source and drain (LDD) features in the source and drain regions.

According to another of the broader forms of the invention, an apparatus includes: a substrate; a gate stack disposed on the substrate that interposes a source and drain region of the substrate; and spacers disposed on sidewalls of the gate stack. An epitaxial layer, lightly doped source and drain (LDD) feature, and heavily doped source and drain (HDD) feature are in the source and drain region of the substrate. The epitaxial layer is aligned with an edge of the spacers, the LDD feature is adjacent the spacers, and the HDD feature is spaced away from the edge of the spacers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
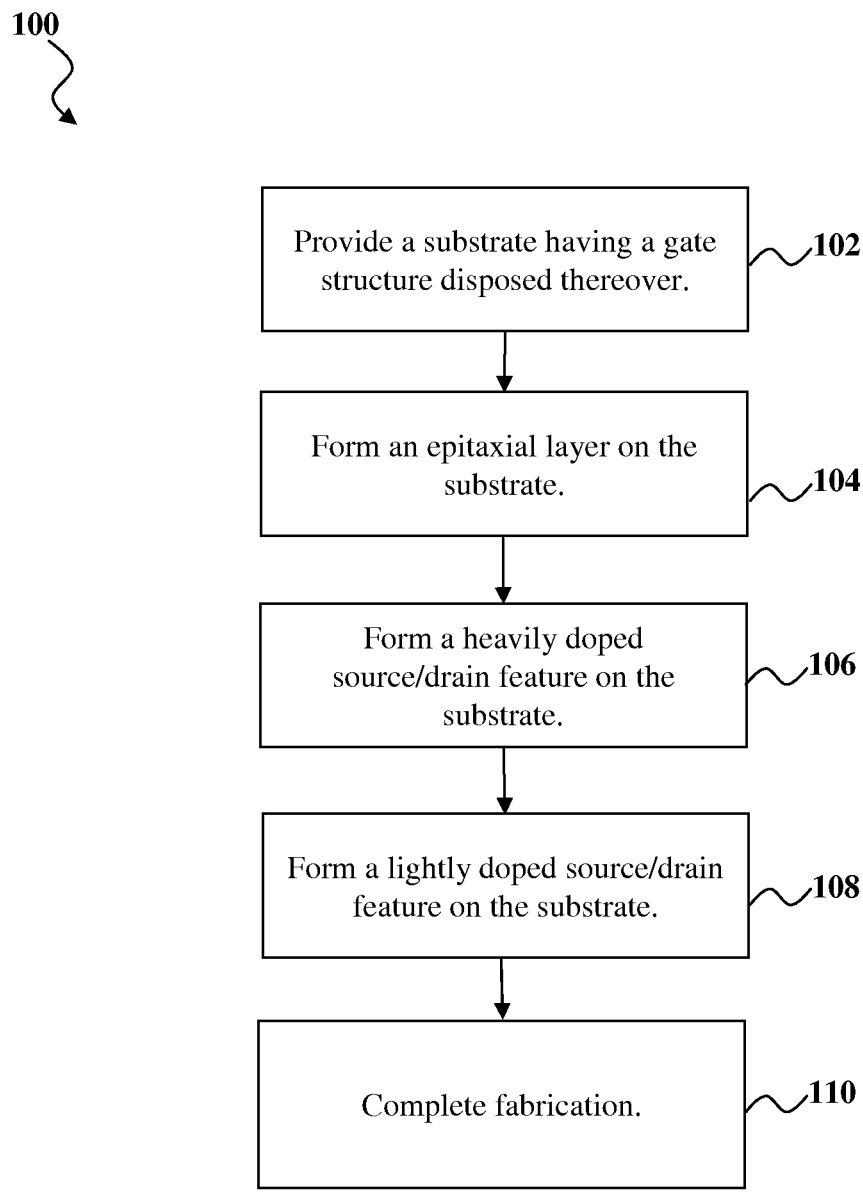
FIG. 1 is a flow chart of a method for fabricating an integrated circuit device according to aspects of the present disclosure.

The present disclosure relates generally to integrated circuit device and methods for manufacturing integrated circuit devices, and more particularly, to methods for forming lightly doped source and drain features of integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-5, a method 100 and a semiconductor device 200 are collectively described below. The semiconductor device 200 illustrates an integrated circuit, or portion thereof, that can comprise memory cells and/or logic circuits. The semiconductor device 200 can include active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. The semiconductor device 200 may additionally include passive components such as resistors, capacitors, inductors, and/or fuses. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
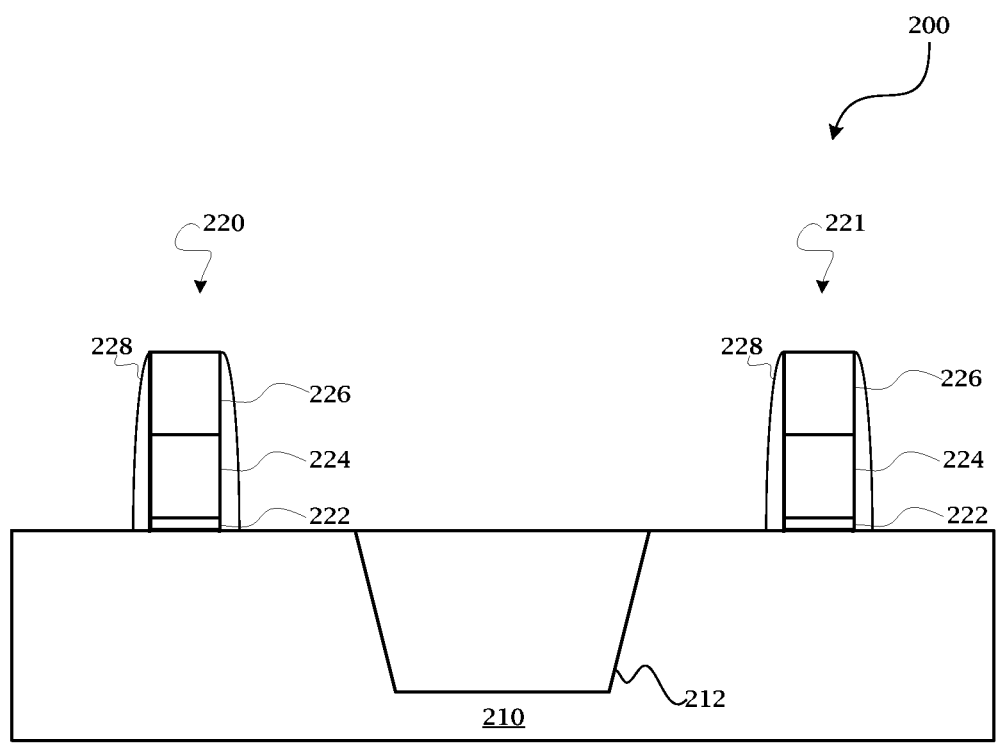
FIGS. 2-5 are various cross-sectional views of embodiments of an integrated circuit device during various fabrication stages according to the method of FIG. 1.

Referring to FIGS. 1 and 2, the method 100 begins at block 102 wherein a substrate 210 is provided. In the present embodiment, the substrate 210 is a semiconductor substrate including silicon. Alternatively, the substrate 210 includes an elementary semiconductor including germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In embodiments where the substrate 210 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative, the semiconductor substrate is a semiconductor on insulator (SOI).

The substrate 210 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. In the present embodiment, the semiconductor device 200 is a CMOS device, and thus, the semiconductor substrate 210 includes various active regions, such as a region configured for an N-type metal-oxide-semiconductor transistor (referred to as an NMOS) and a region configured for a P-type metal-oxide-semiconductor transistor (referred to as a PMOS). It is understood that the semiconductor device 200 may be formed by CMOS technology processing, and thus some processes are not described in detail herein.

An exemplary isolation region 212 is formed on the substrate 210 to define and isolate various active regions of the substrate 210, and in the present embodiment, to isolate the NMOS and PMOS device regions. The isolation region 212 utilizes isolation technology, such as shallow trench isolation (STI) or local oxidation of silicon (LOCOS), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure, such as a thermal oxide liner layer filled with silicon nitride and/or silicon oxide. Then, a polishing process, such as chemical mechanical polishing (CMP) process, can be applied to remove the excessive dielectric materials above the top surface of the substrate, and produce a globally planarized surface.

The substrate 210 includes a gate structure disposed thereover, and in the present embodiment, includes gate structure 220 and gate structure 221 disposed thereover. In the present embodiment, the gate structures 220, 221 include a gate dielectric layer 222, a gate layer 224 (also referred to as a gate electrode), a hard mask layer 226, and spacers 228. The gate dielectric layer 222, gate layer 224, and hard mask layer 226 form gate stacks for the gate structures 220, 221. The gate stacks can include additional layers, including interfacial layers, high-k dielectric layers, capping layers, diffusion/barrier layers, conductive layers, other suitable layers, and/or combinations thereof.

The gate structures 220, 221 are formed by deposition, photolithography patterning, and/or etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods, such as maskless photolithography, electron-beam writing, or ion-beam writing. The etching processes include dry etching, wet etching, and/or other etching methods. It is understood that the gate structures 220, 221 may be formed simultaneously, utilizing the same processing steps and processing materials; independently of one another, utilizing varying processing steps and processing materials; or using a combination of simultaneous and independent processing steps and processing materials.

The gate dielectric layer 222 is formed over the substrate 210 and includes a dielectric material, such as silicon oxide, silicon oxynitride, silicon nitride, a high-k dielectric material layer, other suitable dielectric materials, and/or combinations thereof. Exemplary high-k dielectric materials include $HfO_2$, HfSiO, HfSiON, HfTaO, HfTiO, HfZrO, other suitable high-k dielectric materials, and/or combinations thereof. The gate dielectric layer may include a multilayer structure. For example, the gate dielectric layer 222 could include an interfacial layer, and a high-k dielectric material layer formed on the interfacial layer. The interfacial layer is a grown silicon oxide layer formed by a thermal process or atomic layer deposition (ALD) process.

The gate layer 224 is formed over the gate dielectric layer 222. In the present embodiment, the gate layer 224 is a polycrystalline silicon (or polysilicon) layer. The polysilicon layer may be doped for proper conductivity. Alternatively, the polysilicon is not necessarily doped if a dummy gate is to be formed and is replaced in a subsequent gate replacement process. Alternatively, the gate layer 224 could include a conductive layer having a proper work function, therefore, the gate layer 224 can also be referred to as a work function layer. The work function layer comprises any suitable material, such that the layer can be tuned to have a proper work function for enhanced performance of the associated device. For example, if a P-type work function metal (P-metal) for a PMOS device is desired, TiN or TaN may be used. On the other hand, if an N-type work function metal (N-metal) for NMOS devices is desired, Ta, TiAl, TiAlN, or TaCN, may be used. The work function layer could include doped conducting oxide materials. The gate layer 224 could include other conductive materials, such as aluminum, copper, tungsten, metal alloys, metal silicide, other suitable materials, and/or combinations thereof. For example, where the gate layer 224 includes a work function layer, another conductive layer can be formed over the work function layer.

The hard mask layer 226 is formed over the gate layer 224. The hard mask layer includes silicon nitride, silicon oxynitride, silicon carbide, and/or other suitable dielectric materials. Alternatively, the hard mask layer 226 could include spin-on glass (SOG), fluorinated silica glass (FSG), carbon doped silicon oxide (e.g., SiCOH), Black Diamond® (Applied Materials of Santa Clara, Calif.), Xerogel, Aerogel, amorphous fluorinated carbon, Parylene, BCB (bis-benzocyclobutenes), Flare, SiLK (Dow Chemical, Midland, Mich.), polyimide, TEOS formed oxide, plasma enhanced oxide (PE oxide), high aspect ratio deposition process (HARP) formed oxide, other suitable low-k dielectric materials, and/or combinations thereof.

In the present embodiment, the gate structures 220, 221 include the spacers 228 (also referred to as offset spacers or dummy spacers). The offset spacers 228 are positioned on each side of the gate stacks (i.e., gate dielectric layer 222, gate layer 224, and hard mask layer 226) of the gate structures 220, 221 (e.g., along the sidewalls of the gate dielectric layer 222/gate layer 224/hard mask layer 226). The offset spacers 228 include silicon nitride, or alternatively, other suitable dielectric materials, such as silicon oxide, silicon carbide, silicon oxynitride, and/or combinations thereof. In an example, the offset spacers 228 are formed by blanket depositing a dielectric layer over the semiconductor device 200, and then, anisotropically etching to remove the dielectric layer to form offset spacers 228 as illustrated in FIG. 2.

Figure 3:
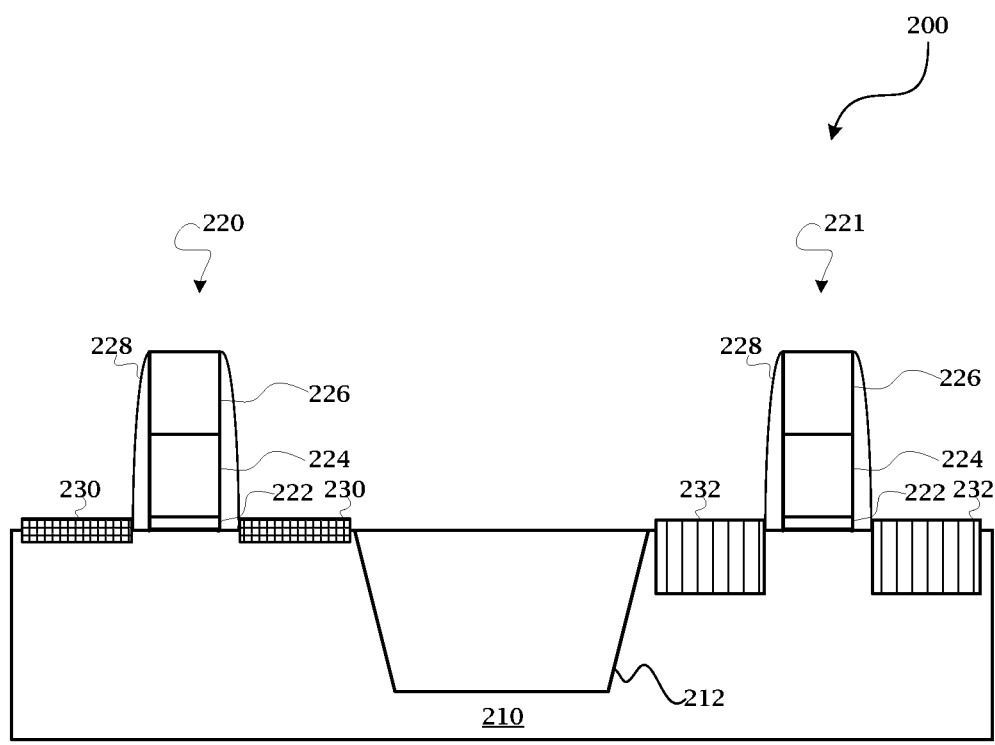

Referring to FIGS. 1 and 3, at block 104, an epitaxial layer is formed on the substrate. In the present embodiment, an epitaxial (epi) process, such as a selective epitaxy growth (SEG), is performed to grow epitaxial layer 230 and epitaxial layer 232 on exposed portions of the substrate 210. The epitaxial layer 230 is formed in a source and drain region of the substrate 210, interposed by the gate structure 220, and the epitaxial layer 232 is formed in another source and drain region of the substrate 210, interposed by the gate structure 221. As shown in FIG. 3, the epitaxial layer 230, 232 are adjacent to the spacers 228, and specifically, the epitaxial layers 230, 232 are aligned with an edge of the spacers 228. Alternatively, the epitaxial process could include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which can interact with the composition of the substrate 210. Prior to growing the epitaxial layers 230 and 232, an etching process can be performed to form a recess/trench in the substrate 210, in which the epitaxial layers are then grown.

In the present embodiment, the epitaxial layers 230, 232 essentially form raised source and drain features of the source and drain regions of the substrate 210. The epitaxial layers 230, 232 comprise a suitable semiconductor material to induce a strained effect and/or other device performance enhancement effect. Exemplary semiconductor materials include silicon, silicon germanium, other suitable materials, or combinations thereof. In the present embodiment, the region of the substrate 210 that includes gate structure 220 is configured as an NMOS device, and the region of the substrate 210 that includes the gate structure 221 is configured as a PMOS device. Accordingly, epitaxial layer 230 includes a Si epi material, and epitaxial layer 232 includes a SiGe epi material. The epitaxial layer 230 and/or epitaxial layer 232 can be in-situ doped or undoped during the epitaxial growth. The epitaxial layers 230, 232 can be doped with a phosphorous implant species, a carbon implant species, other suitable implant species, and/or combinations thereof. For example, in the present embodiment, the epitaxial layer 230 is doped with phosphorous (forming Si:P regions). When the epitaxial layer 230 and/or epitaxial layer 232 is undoped, it is understood that the undoped layer may be doped subsequently.

Figure 4:
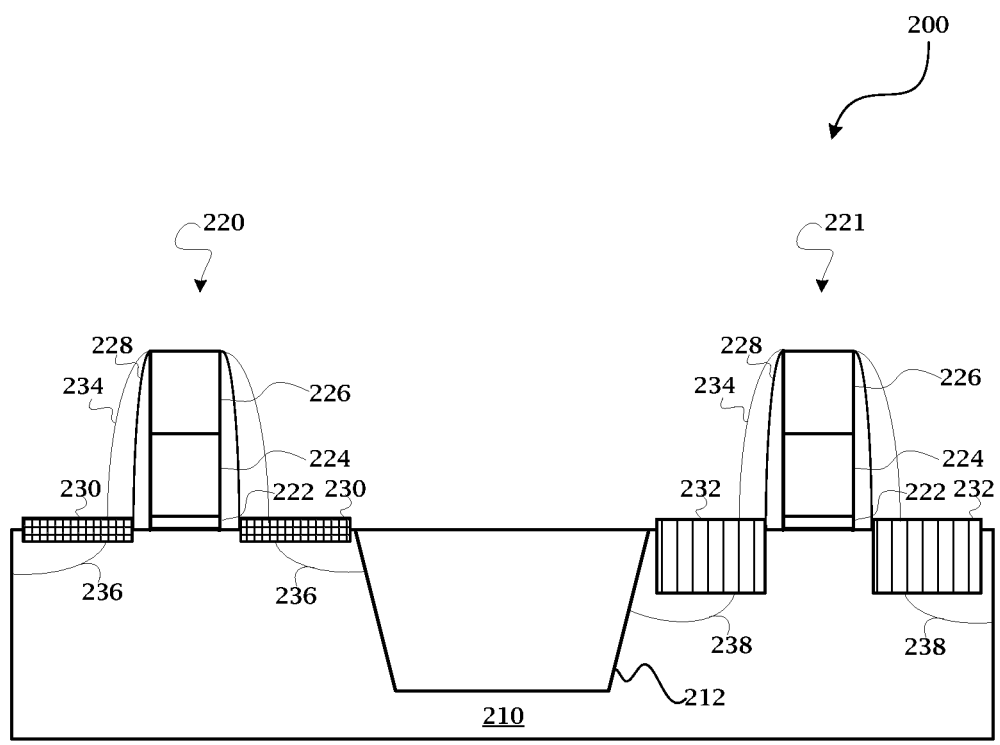

Referring to FIGS. 1 and 4, at block 106, a heavily doped source/drain (HDD) feature is formed on the substrate. In the present embodiment, prior to forming the HDD features, dummy spacers 234 are formed by a suitable process. The dummy spacers 234 are positioned on each side of the offset spacers 228 of gate structures 220, 221. In the present embodiment, the dummy spacers 234 are similar to offset spacers 228. The dummy spacers 234 comprise a dielectric material, such as silicon nitride, silicon oxide, silicon carbide, silicon oxynitride, other suitable materials, and/or combinations thereof. In an example, the dummy spacers 234 are formed by blanket depositing a dielectric layer over the semiconductor device 200, and then, anisotropically etching to remove the dielectric layer to leave dummy spacers 234. Alternatively, the dummy spacers 234 are different than the offset spacers 228, for example, formed of a different material and/or different process.

After forming the dummy spacers 234, heavily doped source/drain features 236, 238 are formed on the substrate 210. More specifically, the HDD features are formed in the source and drain region of the substrate 210. In the present embodiment, HDD features 236 are formed in the source and drain region of the substrate 210 interposed by the gate structure 220 (including in a portion of the epitaxial layer 230), in the region configured for an NMOS device; and HDD features 238 are formed in the source and drain region of the substrate 210 interposed by the gate structure 221 (including in a portion of the epitaxial layer 232), in the region configured for a PMOS device. The HDD features 236, 238 are formed adjacent the spacers 234. In the present embodiment, the HDD features 236, 238 are aligned with an edge of the spacers 234, and as illustrated in FIG. 4, spaced a distance away from the spacers 228. The PMOS device region can be protected during formation of the HDD source/drain features 236 in the NMOS region, and vice versa. For example, a photoresist layer or patterned mask layer may be deposited and patterned over the PMOS device region during formation of the HDD features 236 in the NMOS region, and a photoresist layer or patterned mask layer can be deposited and patterned over the NMOS device region during formation of the HDD features 238 in the PMOS region.

The HDD features 236 and 238 are formed by an ion implantation process, diffusion process, and/or other suitable processes. The doping species depends on the type of device being fabricated, such as an NMOS or PMOS device. For example, since the region including gate structure 220 is configured for an NMOS device region, the HDD features 236 are doped with n-type dopants, such as phosphorus or arsenic; and since the region including the gate structure 221 is configured for a PMOS device region, the HDD features 238 are doped with p-type dopants, such as boron or $BF_2$. In this situation, the HDD features 236 and 238 are formed separately by different ion implantation procedures and using different dopants. The HDD features 236, 238 may comprise various doping profiles. In the present embodiment, the HDD features 236, 238 are self-aligned with the dummy spacers 234. An annealing process, which includes rapid thermal annealing (RTA) and/or laser annealing processes, can subsequently be performed to activate the HDD features 236, 238. The dummy spacers 234 are then removed. Alternatively, the dummy spacers 234 could be removed before the annealing process.

Figure 5:
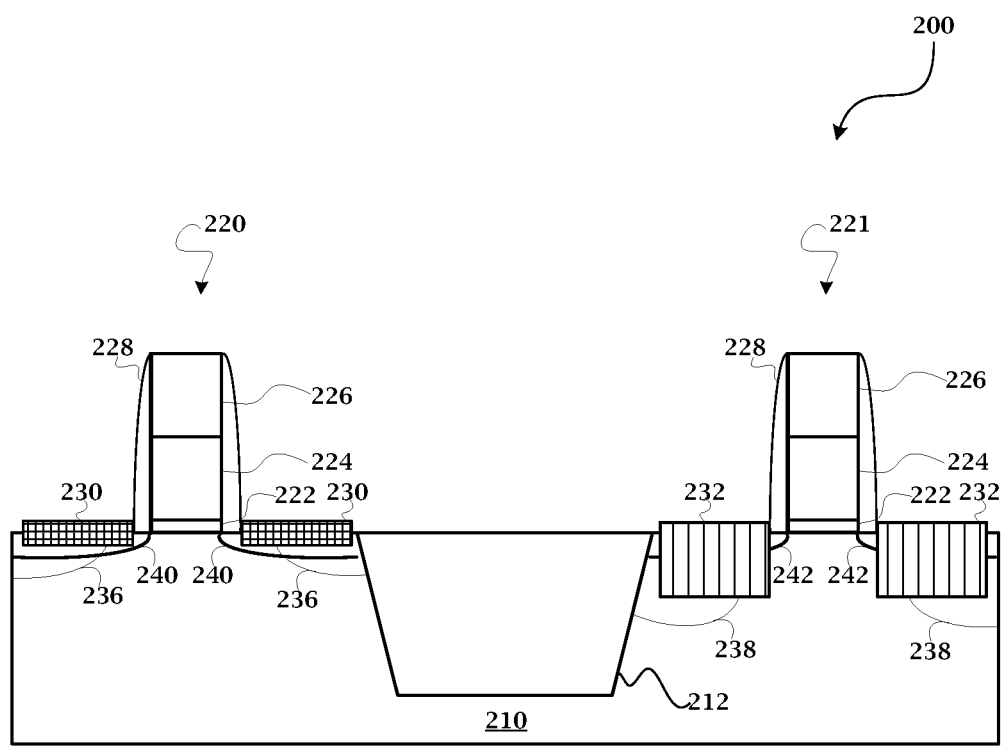

Referring to FIGS. 1 and 5, at block 108, a lightly doped source/drain (LDD) feature is formed on the substrate. More specifically, the LDD features are formed in the source and drain region of the substrate 210. In the present embodiment, LDD features 240 are formed in the source and drain region interposed by the gate structure 220 (including in a portion of the epitaxial layer 230), in the region configured for an NMOS device; and LDD features 242 are formed in the source and drain region interposed by the gate structure 221 (including in a portion of the epitaxial layer 232), in the region configured for a PMOS device. As shown in FIG. 4, the LDD features 240, 242 are adjacent to the spacers 228. In the present embodiment, the LDD features 240, 242 extend under the spacers 228. Alternatively, the LDD features could be aligned with the edge of spacers 228, similar to the epitaxial layers 230, 232. The PMOS device region can be protected during formation of the LDD features in the NMOS region, and vice versa. For example, a photoresist layer or patterned mask layer may be deposited and patterned over the PMOS device region during formation of the LDD features 240 in the NMOS region, and a photoresist layer or patterned mask layer can be deposited and patterned over the NMOS device region during formation of the LDD features 242 in the PMOS region.

The LDD features 240 and 242 are formed by an ion implantation process, diffusion process, and/or other suitable processes. In the present embodiment, a tilt-angle ion implantation process is implemented to form the LDD features 240, 242. The tilt-angle ion implantation process implements an ion beam with an angle to a direction perpendicular to the substrate 210. The large-angle tilted ion implantation is implemented with a suitable tilt angle tuned to form the LDD features 240, 242. Because the method 100 forms the LDD features after forming the epitaxial layers 230, 232 in the S/D regions of the substrate 210, a maximum tilt-angle can be increased, while still avoiding shadowing effects caused by a height of the gate stack, particularly the hard mask layer 226. For example, in the present embodiment, a tilt-angle utilized can be greater than 20°, such as approximately 30°. This occurs because a thickness/height of the gate stack, particularly hard mask layer 226, is reduced by earlier processing (for example, by the epitaxial growth process and/or HDD feature formation process)(not shown in FIGS. 2-5), alleviating shadowing effects caused when the hard mask layer 226 is too high.

Further, conventional techniques, which form LDD features prior to the epitaxial layers, exhibit diffusion of LDD dopants during subsequent thermal processing, such as the epi growth processes. This limits a thermal budget for forming the epitaxial layers, reducing an ability to achieve target thicknesses for the epitaxial layers. In the present embodiment, which implements forming LDD features after the epi growth process, it has been observed that target thicknesses for the epitaxial layers can be better achieved since the epi growth processes are not limited by out-diffusion of dopants in the LDD features. This provides improved quality epi layers. Even further, due to the decreased out-diffusion of the LDD dopants, improved overall device performance has been observed, including improved ultra-shallow junction formation and improved short channel effects. It is understood that different embodiments may have different advantages, and that no particular advantage is necessarily required of any embodiment.

The doping species depends on the type of device being fabricated, such as an NMOS or PMOS device. For example, since the region including gate structure 220 is configured for an NMOS device region, the LDD features 240 are doped with n-type dopants, such as phosphorus or arsenic; and since the region including gate structure 221 is configured for a PMOS device region, the LDD features 242 are doped with p-type dopants, such as boron or $BF_2$. In this situation, the LDD features 240 and 242 are formed separately by different ion implantation procedures and using different dopants. The LDD features 240, 242 may comprise various doping profiles. An annealing process, which includes rapid thermal annealing (RTA) and/or laser annealing processes, can subsequently be performed to activate the LDD features 240, 242. In the present embodiment, the exemplary method 100 forms the HDD features 236, 238 prior to the LDD features 240, 242. Alternatively, the HDD features 236, 238 could be formed after the LDD features 240, 242. It should be noted that because the LDD features 240, 242 are formed after the epitaxial layer 230, 232, the semiconductor device 100 includes epitaxial layers 230, 232 and LDD features 240, 242 adjacent to the spacers 228 and aligned with an edge of the spacers 228, while the HDD features 236, 238 are spaced a distance away from the edge of the spacers 228.

Referring to FIG. 1, at block 110, fabrication of the semiconductor device 200 continues to complete fabrication as briefly discussed below. The semiconductor device 200 may undergo further CMOS or MOS technology processing to form various features known in the art. For example, the method 100 may proceed to form main spacers, similar to offset spacers 228 and/or dummy spacers 234. In an embodiment, the offset spacers 228 are removed prior to forming the main spacers. Further, contact features, such as silicide regions, may also be formed. The contact features may be coupled to the source and drain regions of the substrate 210 (e.g., epitaxial layer regions 230, 232). The contact features comprise silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate 210 and a chemical mechanical polishing (CMP) process is further applied to the substrate to planarize the substrate. Further, a contact etch stop layer (CESL) may be formed on top of the gate structures 220, 221 before forming the ILD layer.

In an embodiment, the gate layer/electrode 224 remains polysilicon in the final device. In another embodiment, a gate replacement process (or gate last process) is performed, wherein the polysilicon gate layer 224 is replaced with a metal gate. For example, a metal gate may replace the gate layer (i.e., polysilicon gate layer) of the gate structures 220, 221. The metal gate in the gate structure 220 could have a different work function than the metal gate in the gate structure 221. The metal gates include liner layers, work function layers, conductive layers, metal gate layers, fill layers, other suitable layers, and/or combinations thereof. The metal gate layers include any suitable material, such as aluminum, copper, tungsten, titanium, tantulum, tantalum aluminum, titanium nitride, tantalum nitride, nickel silicide, cobalt silicide, silver, TaC, TaSiN, TaCN, TiAl, TiAlN, WN, metal alloys, other suitable materials, and/or combinations thereof. In a gate last process, the CMP process on the ILD layer is continued to expose the poly gate layer 224 (and hard mask layer 226) of the gate structures 220, 221, and an etching process is performed to remove the gate layer 224 (and hard mask layer 226) thereby forming trenches. The trenches are filled with a proper work function metal (e.g., p-type work function metal and n-type work function metal) for the PMOS devices and the NMOS devices.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
forming a gate structure over the substrate;
forming inner spacers on sidewalls of the gate structure;
forming an epitaxial layer in a source and drain region of the substrate that is interposed by the gate structure, wherein the epitaxial layer physically contacts the inner spacers on the sidewalls of the gate structure;
after forming the epitaxial layer, forming outer spacers on the inner spacers and the epitaxial layer such that the outer spacers physically contact the inner spacers and the epitaxial layer;
after forming the outer spacers, forming a heavily doped source and drain (HDD) feature in the source and drain region; and
after forming the HDD feature, forming a lightly doped source and drain (LDD) feature in the source and drain region, wherein after forming the LDD feature the epitaxial layer physically contacts the inner spacers on the sidewalls of the gate structure.

2. The method of claim 1 wherein forming the LDD feature in the source and drain region includes performing a tilt-angle ion implantation process.

3. The method of claim 2 wherein performing the tilt-angle ion implantation process includes utilizing a tilt-angle greater than about 20°.

4. The method of claim 1 wherein forming the epitaxial layer in the source and drain region interposed by the gate structure includes performing a silicon or silicon germanium epitaxial growth process.

5. The method of claim 4 further comprising doping the epitaxial layer with a carbon or phosphorous implant species.

6. The method of claim 1 wherein forming the gate structure includes forming a gate stack that includes a polysilicon layer and a hard mask layer over the polysilicon layer.

7. The method of claim 1, further comprising:
removing the outer spacer prior to forming the LDD feature in the source and drain region; and
after removing the outer spacer, performing an annealing process on the HDD feature prior to forming the LDD feature in the source and drain region.

8. A method comprising:
forming a first gate structure and a second gate structure over a substrate;
forming an inner spacer on a sidewall of the first gate structure;
forming an epitaxial layer of a first material in a source and drain region of the substrate that is interposed by the first gate structure, wherein the epitaxial layer physically contacts the inner spacer on the sidewall of the first gate structure;
forming an epitaxial layer of a second material in another source and drain region of the substrate that is interposed by the second gate structure; and
after forming the epitaxial layer of the first material in the source and drain region of the substrate that is interposed by the first gate structure, forming an outer spacer on the inner spacer and the epitaxial layer of the first material such that the outer spacer physically contacts the inner spacer and the epitaxial layer of the first material;
after forming the epitaxial layer, forming heavily doped source and drain (HDD) features in the source and drain region and the another source drain region of the substrate; and
after forming the HDD feature, forming lightly doped source and drain (LDD) features in the source and drain region and the another source drain region of the substrate, wherein after forming the LDD features in the source and drain region the epitaxial layer physically contacts the inner spacer on the sidewall of the first gate structure.

9. The method of claim 8 wherein forming the epitaxial layer of the first material includes epitaxially growing a silicon layer, and forming the epitaxial layer of the second material includes epitaxially growing a silicon germanium layer.

10. The method of claim 9 further comprising implanting the silicon layer with a phosphorous or carbon implant species.

11. The method of claim 8 wherein forming the LDD features in the source and drain region includes performing a tilt-angle ion implantation process.

12. The method of claim 8 wherein forming the LDD features in the source and drain region interposed by the first gate structure includes performing an implantation process with a first implant species, and forming the LDD features in the another source and drain region interposed by the second gate structure includes performing an implantation process with a second implant species, the second implant species being different than the first implant species.

13. The method of claim 8 further comprising performing a gate replacement process that includes:
replacing the first gate structure with a gate layer having a first work function; and
replacing the second gate structure with a gate layer having a second work function.

14. The method of claim 8, wherein the epitaxial layer of the first material extends to a first depth within the substrate and the epitaxial layer of the second material extends to a second depth within the substrate, the second depth being different than the first depth.

15. The method of claim 8, wherein forming the HDD features in the source and drain region interposed by the first gate structure includes forming the HDD features to a first depth within the source and drain region interposed by the first gate structure, and
wherein forming the HDD features in the another source and drain region interposed by the second gate structure includes forming the HDD features to a second depth within the source and drain region interposed by the second gate structure, the second depth being different than the first depth.

16. A method comprising:
providing a substrate;

forming a gate structure over the substrate, the gate structure including a first sidewall spacer;

forming an epitaxial layer in a source and drain region of the substrate that is interposed by the gate structure, wherein the epitaxial layer physically contacts the first sidewall spacer of the gate structure;

after forming the epitaxial layer, forming a second sidewall spacer on the first sidewall spacer such that the second sidewall spacer physically contacts the first sidewall spacer and the epitaxial layer;

after forming the second sidewall spacer, forming a heavily doped source and drain (HDD) feature in the source and drain region; and after forming the HDD feature in the source and drain region, forming a lightly doped source and drain (LDD) feature in the source and drain region, wherein after forming the LDD feature the epitaxial layer physically contacts the first sidewall spacer of the gate structure.

17. The method of claim 16, further comprising removing the second sidewall spacer prior to forming the LDD features.

18. The method of claim 16, wherein the HDD feature in the source and drain region has an edge that is aligned with an outer edge of the second sidewall spacer.

19. The method of claim 16, wherein the LLD feature has an edge that is aligned with an inner edge of the first spacer.

20. The method of claim 16, wherein forming the LDD feature in the source and drain region includes performing a tilt-angle ion implantation process.

* * * * *